(12) United States Patent
Wang et al.

(10) Patent No.: US 10,595,451 B1
(45) Date of Patent: Mar. 17, 2020

(54) SHIELDING STRUCTURE OF CIRCUIT BOARD AND ELECTRONIC DEVICE HAVING THE SAME

(71) Applicant: Getac Technology Corporation, Hsinchu County (TW)

(72) Inventors: Min-Yu Wang, Taipei (TW); Chi-Jung Wu, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/210,067

(22) Filed: Dec. 5, 2018

(51) Int. Cl.
*H05K 9/00* (2006.01)
*H05K 1/02* (2006.01)

(52) U.S. Cl.
CPC ......... *H05K 9/0088* (2013.01); *H05K 1/0215* (2013.01); *H05K 1/0216* (2013.01)

(58) Field of Classification Search
USPC ........................................ 361/816
See application file for complete search history.

(56) References Cited

U.S. PATENT DOCUMENTS

| | | | | |
|---|---|---|---|---|
| 4,857,668 A | * | 8/1989 | Buonanno | H05K 9/0015 174/354 |
| 5,031,076 A | * | 7/1991 | Kiku | H05K 5/0269 361/725 |
| 6,028,775 A | * | 2/2000 | Batten, Jr. | H05K 9/0043 174/361 |
| 6,147,879 A | * | 11/2000 | Batten, Jr. | H05K 9/0043 174/377 |
| 9,980,417 B1 | * | 5/2018 | Ji | H05K 9/0015 |
| 2017/0034960 A1 | * | 2/2017 | Ham | H05K 9/0015 |

* cited by examiner

*Primary Examiner* — Hung S. Bui
(74) *Attorney, Agent, or Firm* — Locke Lord LLP; Tim Tingkang Xia, Esq.

(57) ABSTRACT

A shielding structure of a circuit board and an electronic device having the structure are disclosed. The electronic device includes a casing, a circuit board and a shielding structure. The shielding structure includes a shielding film and a ground guide member electrically configured on the circuit board. The shielding film includes two insulation layers and a metal layer placed between the two insulation layers, hence forming a sandwich structure. One of the insulation layers is adhered to the circuit board and is provided with an opening. The metal layer is exposed via the opening to form a guide portion, such that the shielding film can be electrically connected to the ground guide member through the exposed guide portion to further be grounded. Thus, complete noise shielding effects and efficient noise grounding effects are achieved.

15 Claims, 8 Drawing Sheets

US 10,595,451 B1

SHIELDING STRUCTURE OF CIRCUIT BOARD AND ELECTRONIC DEVICE HAVING THE SAME

BACKGROUND OF THE INVENTION

Field of the Invention

The present invention relates to a design for noise shielding and, more particularly, to a shielding structure of a circuit board and an electronic device having the structure.

Description of the Prior Art

For wireless transmission, an electronic device is usually configured with a wireless radio frequency (RF) component. However, signals in numerous different frequencies are present in a circuit board of an electronic device, and these signals are considered as noise in regard to the wireless RF component and need to be separated and grounded.

A current separation structure includes a metal blocking wall protruding from a metal casing, and a guide blocking wall protruding from the circuit board and corresponding to the metal blocking wall. The circuit board is provided in the metal casing, such that the metal blocking wall and the guide blocking wall are mutually butted, conducted and jointly form a blocking wall assembly. The blocking wall assembly demarcates the circuit board into a plurality of blocks, in a way that the noise in each block is separated and grounded instead of being leaked outwards, thus reducing the influence of such noise on the wireless RF component.

However, owing to design limitations of the casing, such as a heat pipe and/or input/output ports, the metal blocking wall is inevitably disconnected and breached if the metal blocking wall is processed according to the above designs. As a result, a drawback that the noise is leaked out from the breaches and cannot be completely separated within the blocking wall assembly is incurred.

SUMMARY OF THE INVENTION

It is an object of the present invention to provide a shielding structure of a circuit board and an electronic device having the structure, wherein the structure is capable of completely shielding and grounding noise.

To achieve the above object, the present invention provides a shielding structure of a circuit board. The shielding structure is for shielding the circuit board, and includes at least one ground guide member, electrically configured on the circuit board; and a shielding film. The shielding film includes a first insulation layer; a second insulation layer, adhered to the circuit board, the second insulation layer provided with at least one opening corresponding to the at least one ground guide member; and a metal layer, stacked and connected between the first insulation layer and the second insulation layer, the metal layer is exposed via the at least one opening to form at least one guide portion. The shielding film is electrically connected to the at least one ground guide member through the at least one guide portion and is thus grounded.

The present invention further provides an electronic device having a shielding structure. The electronic device includes a casing; a circuit board, provided in the casing; and a shielding structure.

The shielding structure includes at least one ground guide member, electrically configured on the circuit board; and a shielding film. The shielding film includes a first insulation layer; a second insulation layer, adhered to the circuit board, the second insulation layer is provided with at least one opening corresponding to the at least one ground guide member; and a metal layer, stacked and connected between the first insulation layer and the second insulation layer, the metal layer is exposed via the at least one opening to form at least one guide portion.

The shielding film is electrically connected to the at least one ground guide member through the at least one guide portion and is thus grounded.

Compared to the prior art, the present invention achieves the effects of completely and effectively shielding noise and grounding the noise, thereby reducing the influence generated by the noise on a wireless RF component.

DETAILED DESCRIPTION OF THE EMBODIMENTS

Details and technical contents of the present invention are provided with the accompanying drawings below. It should be noted that the accompanying drawings are only for reference and illustration purposes and are not to be construed as limitations to the present invention.

Figure 1:
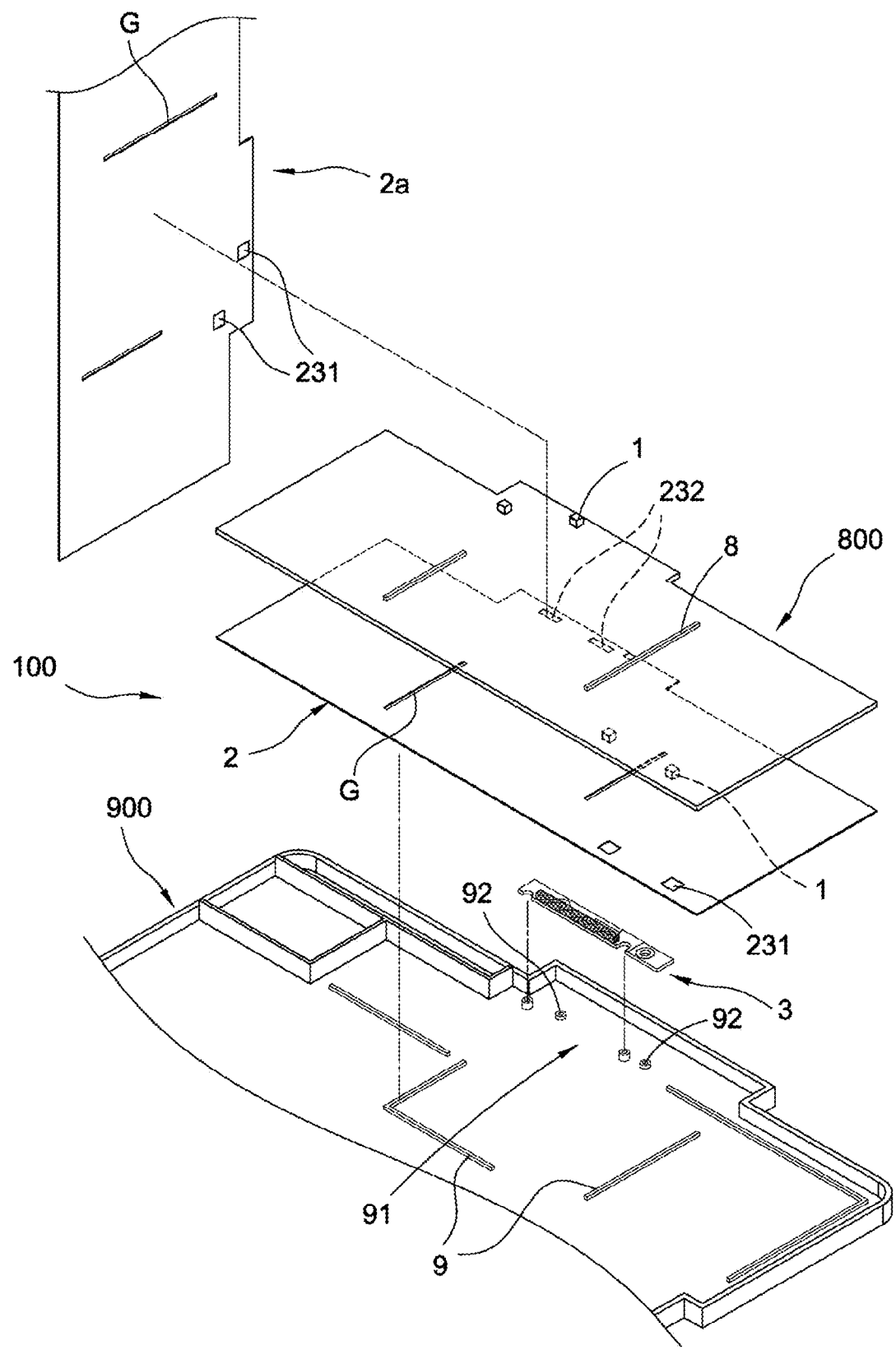
FIG. 1 is an exploded perspective diagram of an electronic device of the present invention.
Figure 2:
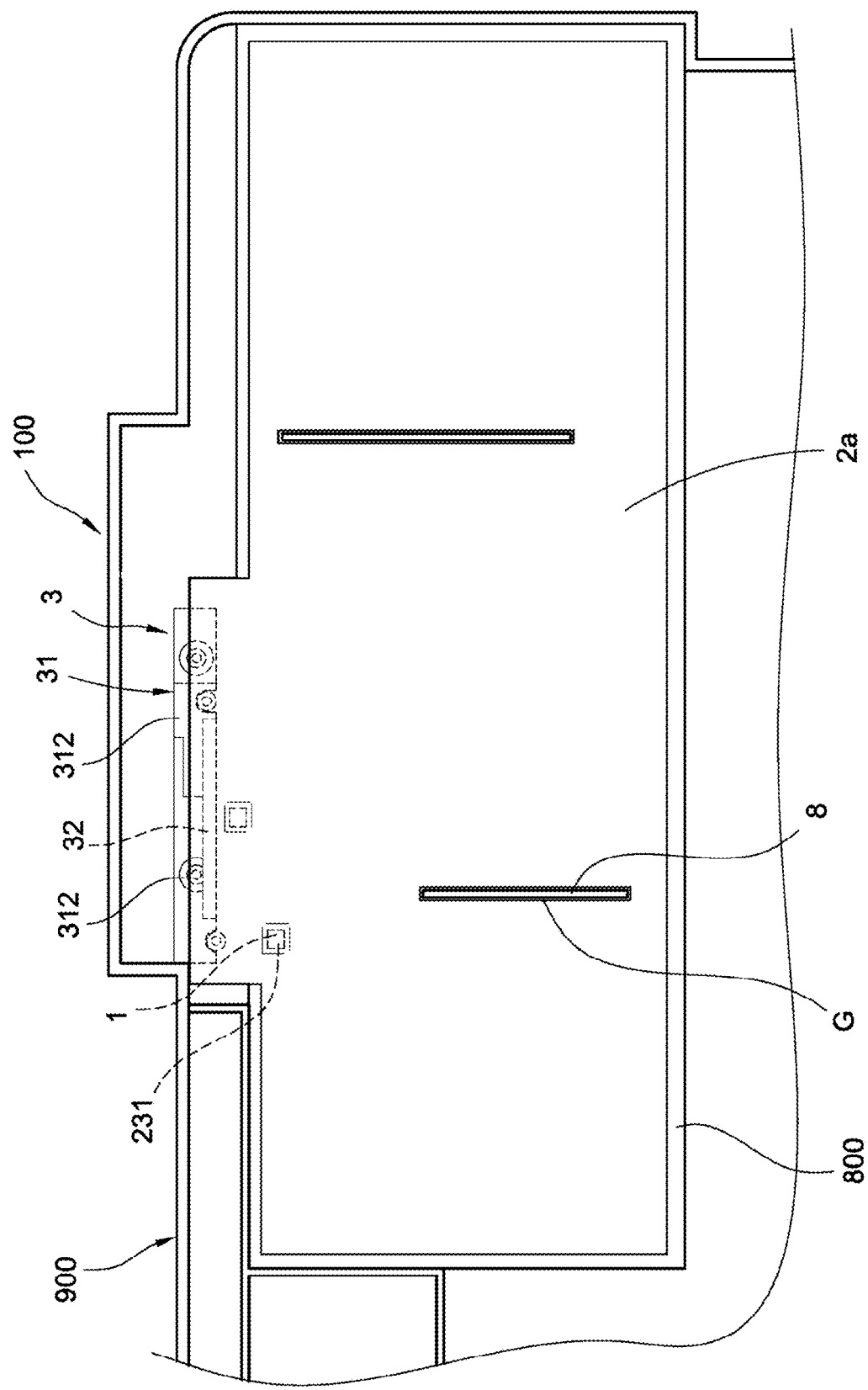
FIG. 2 is a top schematic diagram of the electronic device of the present invention in FIG. 1 in assembly.

As shown in FIG. 1 and FIG. 2, the present invention provides a shielding structure of a circuit board and an electronic device having the structure. The electronic device includes a casing 900, a circuit board 800 and a shielding structure 100. An inner surface of the casing 900 made of a metal material is provided with multiple metal blocking walls 9. Two surfaces (or any one surface) of the circuit board 800 are both provided with multiple guide blocking walls 8, and the guide blocking walls 8 (not shown) on one surface of the circuit board 800 correspond to the metal blocking walls 9. As such, when the circuit board 800 is arranged in the casing 900, the guide blocking walls 8 on one surface of the circuit board 800 are oppositely abutted and conducted with the metal blocking walls 9, and together form a blocking wall assembly (not shown). The shielding structure 100 is for shielding the circuit board 800.

As shown in FIG. 1 to FIG. 4, the shielding structure 100 includes at least one ground guide member 1 and a shielding film 2. In this embodiment, an external blocking wall assembly 3 is further included.

The ground guide member 1 may be any elastic guide element. In this embodiment, the ground guide member 1 includes a flexible metal plate 11 and an elastic support body 12. The flexible metal plate 11 encircles the elastic support body 12 to form the ground guide member 1 having an elastic deformation function. The flexible metal plate 11 may be any metal plate, and is exemplified by an aluminum plate in this embodiment for illustration. The elastic support body 12 may be any object having an elastic support function, e.g., a sponge, a foam sponge, a spring or a spring piece, and is exemplified by a foam sponge in this embodiment for illustration.

The ground guide member 1 is electrically connected to the circuit board 800. More specifically, the circuit board 800 is electrically configured with at least one plate guide portion 81, and the ground guide member 1 is welded to the plate guide portion 81 through the flexible metal plate 11 and is electrically connected to the plate guide portion 81. The ground guide member 1 may be in a quantity of one, or two or more. The present invention does not specifically define the quantity of the ground guide member 1, and the quantity may be determined according to actual requirements. In this embodiment, multiple ground guide members 1 are given as an example for illustration.

The shielding film 2 includes a first insulation layer 21, a second insulation layer 22 and a metal layer 23 that are sequentially stacked. The metal layer 23 is stacked and connected between the first insulation layer 21 and the second insulation layer 22. The second insulation layer 22 is provided with a plurality of openings 221 corresponding to the ground guide members 1, allowing the metal layer 23 to be exposed via the openings 221 to form a plurality of guide portions 231. The present invention does not specifically define dimensions of the shielding film 2, given that the shielding film 2 can cover any one surface or a partial range of any one surface of the circuit board 800.

The shielding film 2 is provided with multiple gaps G corresponding to the guide blocking walls 8 on the circuit board 800, allowing the guide blocking walls 8 to be exposed via the gaps G, further facilitating the butting and conduction with the metal blocking walls 9.

The shielding film 2 is adhered to one surface of the circuit board 800 by means of an adhesive or a double-sided tape (not shown), such that the guide portions 231 are correspondingly pressed on the ground guide members 1 to become mutually electrically conducted with the ground guide members 1. In the present invention, the shielding film 2 may be fixed on the circuit board 800 by means of multiple screw elements (not shown), and the shielding film 2 having been fixed enables the second insulation layer 22 to be adhered to one surface of the circuit board 800. In addition to being adhered to an entire range of one surface of the circuit board 800, the shielding film 2 may also be only adhered to at least one partial range of one surface of the circuit board 800.

Thus, even if a breach occurs on the metal blocking walls 9 of the casing 900, the noise from the circuit board 800 remains shielded within the shielding film 2; in addition, the noise is further grounded from the metal layer 23 through the guide portions 231 and the ground guide members 1, further reducing the influence that the noise generates on a wireless RF component (not shown) configured in the electronic device.

Figure 3:
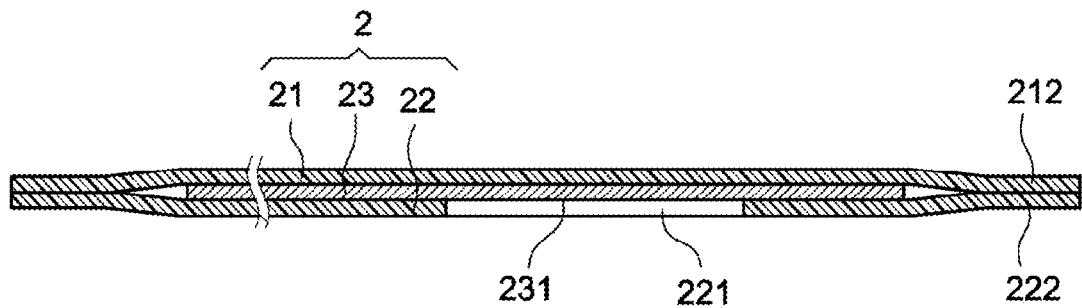
FIG. 3 is a cross-sectional schematic diagram of a shielding film in an electronic device of the present invention.
Figure 4:
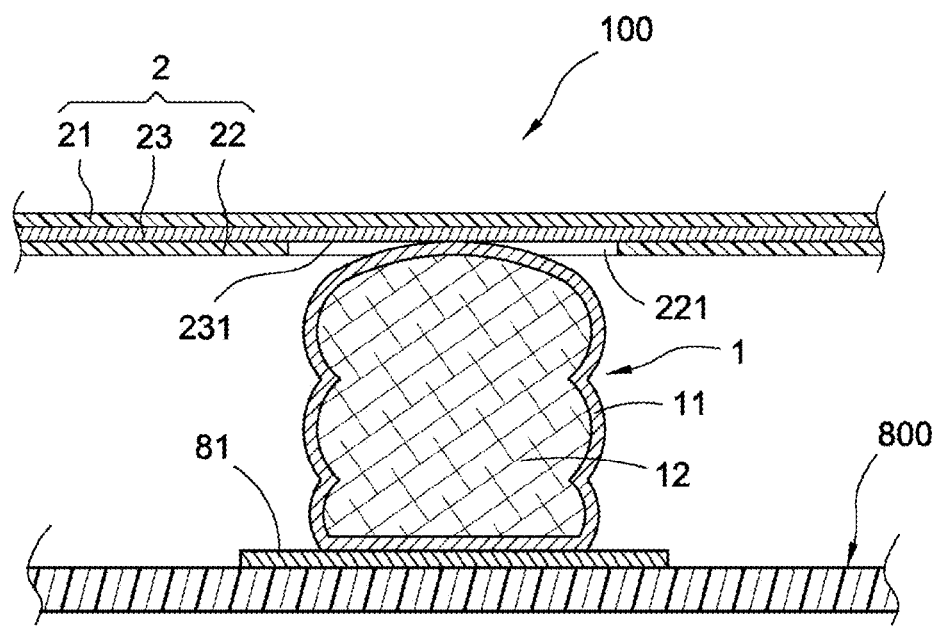
FIG. 4 is a cross-sectional schematic diagram of a shielding structure in contact and conduction with a circuit board in an electronic device of the present invention.

Preferably, the shielding film 2 may be an edge-sealed film structure, as shown in FIG. 3. Primarily, areas of the first insulation layer 21 and the second insulation layer 22 are designed to be both greater than the area of the metal layer 23, such that the first insulation layer 21 has a first edge 212 protruding from the metal layer 23, the second insulation layer 22 has a second edge 222 protruding from the metal layer 23, and the first edge 212 and the second edge 222 are mutually adhered. Thus, such assembly is capable of completely enveloping the metal layer 23 in the edge-sealed shielding film 2 within the first insulation layer 21 and the second insulation layer 22. In this case, even if the shielding film 2 has the metal layer 23, the metal layer 23 does not come into contact with nearby electronic components and therefore no short circuit occurs.

In other embodiments not shown in the drawings, the first edge 212 and the second edge 222 may not be adhered but only protrude from the metal layer 23. Thus, even if nearby electronic components erroneously come into contact with the shielding film 2, the electronic components come into contact with only the first edge 212 and the second edge 222 protruding from the metal layer 23; therefore, no short circuit occurs as well.

It should be noted that, the metal layer 23 may be any metal film having noise shielding and electrical conduction functions, and is, for example, selected from a group consisting of aluminum, silver and copper. In this embodiment, the metal layer 23 is exemplified by aluminum foil for illustration. The first insulation layer 21 and the second insulation layer 22 may be any insulation films having an insulation function, and are exemplified by a polyethylene terephthalate (PET) film for illustration in this embodiment, and more particularly, a black and opaque PET film. Furthermore, the thickness of the metal layer 23 is 0.1 mm, and the thicknesses of the first insulation layer 21 and the second insulation layer 22 are both within 0.01 mm to 0.03 mm.

Moreover, as shown in FIG. 1, in addition to adhering the shielding film 2 to one surface of the circuit board 800, another shielding film 2a may be adhered to another surface or a partial range of another surface of the circuit board 800, such that both surfaces of the circuit board 800 can be shielded. In other embodiments not shown in the drawings, the shielding films 2 and 2a can be provided with a corresponding exposure hole for exposing some electronic components, and the first insulation layer 21 and the second insulation layer 22 are respectively provided with the first edge 212 and the second edge 222 protruding from the metal layer 23 at positions corresponding to an inner periphery of the exposure hole, so as to provide a similar effect of preventing short circuit between the metal layer 23 and other electronic components.

As shown in FIG. 1 and FIG. 2, owing to design limitations, the casing 900 may not be able to form the metal blocking walls 9 and may have a larger blocking wall breach 91, through which the noise can be leaked out. Therefore, particularly for a position near a central processing unit (CPU) that generates a greater amount of noise, containment needs to be implemented. In this embodiment, an external blocking wall assembly 3 is additionally provided as an example for illustration.

Figure 5:
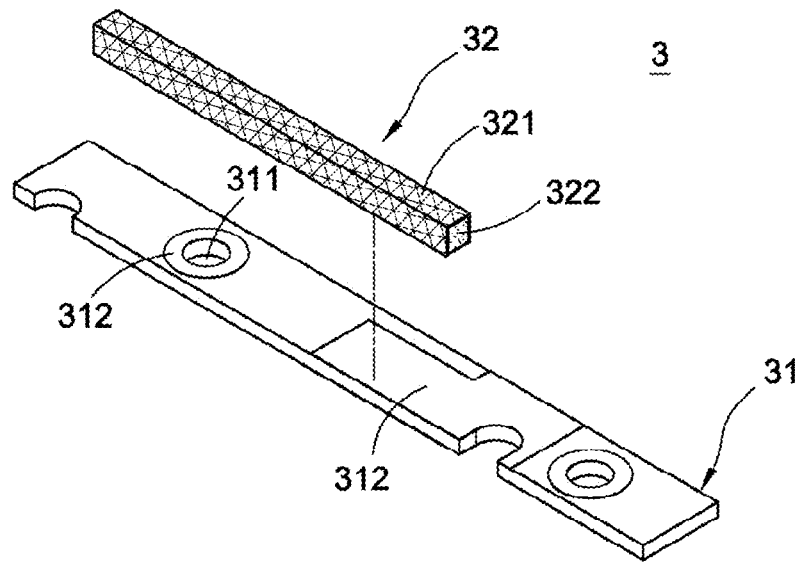
FIG. 5 is an exploded perspective diagram of an external blocking wall assembly in an electronic device of the present invention.
Figure 6:
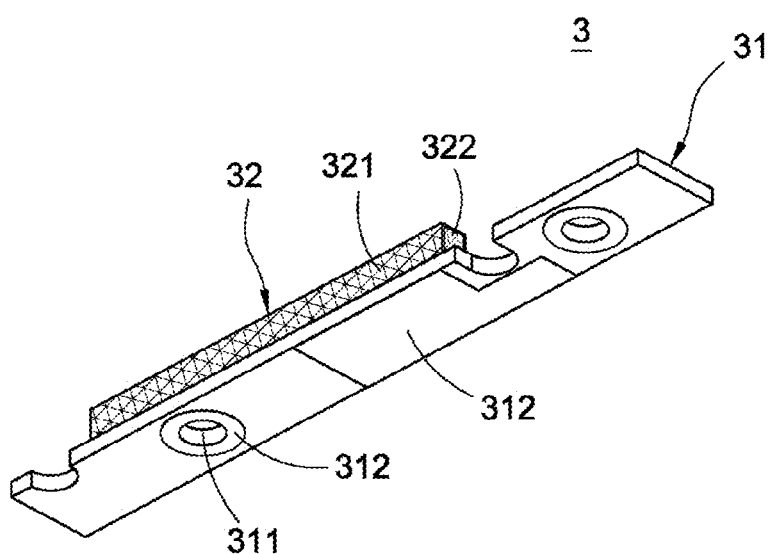
FIG. 6 is a perspective assembly diagram of the present invention from another viewing angle according to FIG. 5.
Figure 7:
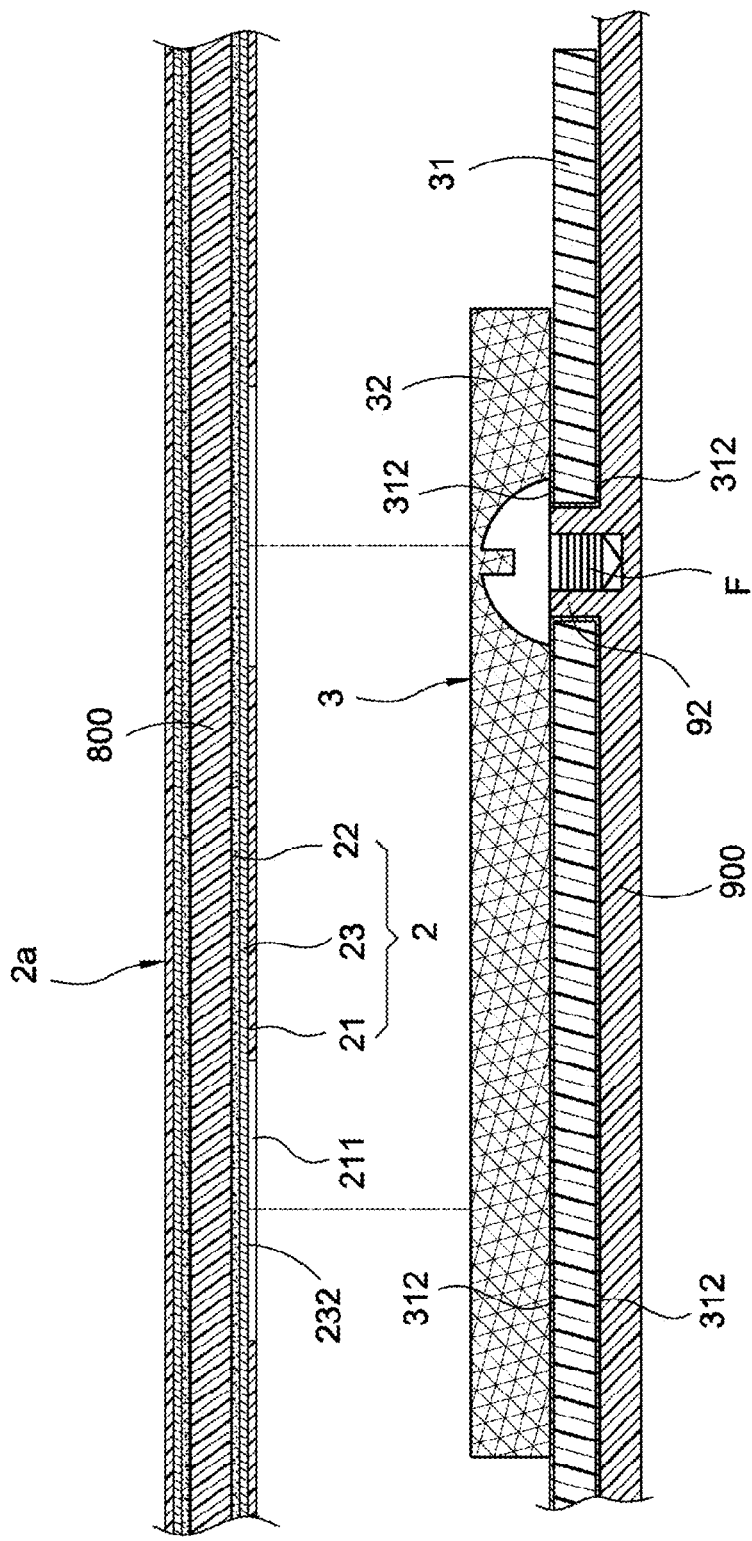
FIG. 7 is a cross-sectional schematic diagram of an external blocking wall assembly before being in contact and conduction with a shielding film in an electronic device of the present invention.

As shown in FIG. 5 to FIG. 7 with reference to FIG. 1 and FIG. 2, the external blocking wall assembly 3 is provided on the casing 900 at a position corresponding to the blocking wall breach 91 so as to seal the blocking wall breach 91, and the external blocking wall assembly 3 is electrically connected to the casing 900. The first insulation layer 21 of the shielding film 2 is provided with at least one external opening 211, allowing the metal layer 23 to be exposed via the at least one external opening 211 to form at least one external guide portion 232. The shielding film 2 is electrically connected to the external blocking wall assembly 3 through the external guide portion 232 and is thus grounded.

More specifically, the casing 900 is protrudingly provided with multiple metal fixing columns 92 at positions of the blocking wall breach 91. The external blocking wall assembly 3 includes an external circuit board 31 and a ground guide wall 32. The external circuit board 31 is provided on the casing 900 at a position corresponding to the blocking wall breach 91 and is electrically connected to the casing 900. The ground guide wall 32 is fixed to the external circuit board 31 and is electrically connected to the external circuit board 31. The shielding film 2 is electrically connected to the ground guide wall 32 through the external guide portion 232 and is thus grounded.

Each of two surfaces of the external circuit board 31 is provided with multiple external plate guide portions 312, and the external circuit board 31 is further provided with at least one fixing hole 311 on at least one of the external plate guide portions 312. Thus, when the external circuit board 31 is arranged on the casing 900, the metal fixing columns 92 correspondingly pass through the fixing holes 311, and then a fixing element F is used to correspondingly fix the external circuit board 31 to the metal fixing columns 92, such that the fixing element F made of a metal material can accordingly come into contact and be in conduction with the external plate guide portions 312 around the fixing holes 311.

As such, the external plate guide portions 312 at the top surface of the external circuit board 31 and the external plate guide portions 312 at the bottom surface of the external circuit board 31 are in conduction with each other because of the fixing connection between the fixing element F made of a metal material and the metal fixing columns 92. Furthermore, the ground guide wall 32 having an electrical conduction function exactly electrically crosses between the two external plate guide portions 312 at the top surface of the external circuit board 31, and the casing 900 made of a metal material is electrically in contact with the external plate guide portions 312 at the bottom surface of the external circuit board 31. Therefore, the shielding film 2 can be electrically connected to the ground guide wall 32 through the external guide portions 232 and is thus grounded.

In this embodiment, the ground guide wall 32 having an elastic deformation function includes a flexible guide outer layer 321 and an external elastic support body 322. The flexible guide outer layer 321 encircles or envelops the external elastic support body 322, and the ground guide wall 32 is fixed and electrically in contact with the external circuit board 31 through the flexible guide outer layer 321. The flexible guide outer layer 321 may be any outer layer having a flexible guide and conducting function, e.g., a piece of electrically conductive fabric. The external elastic support body 322 may be any object having an elastic support function, e.g., a sponge, a foam sponge, a spring or a spring piece, and is exemplified by a foam sponge in this embodiment for illustration.

Figure 8:
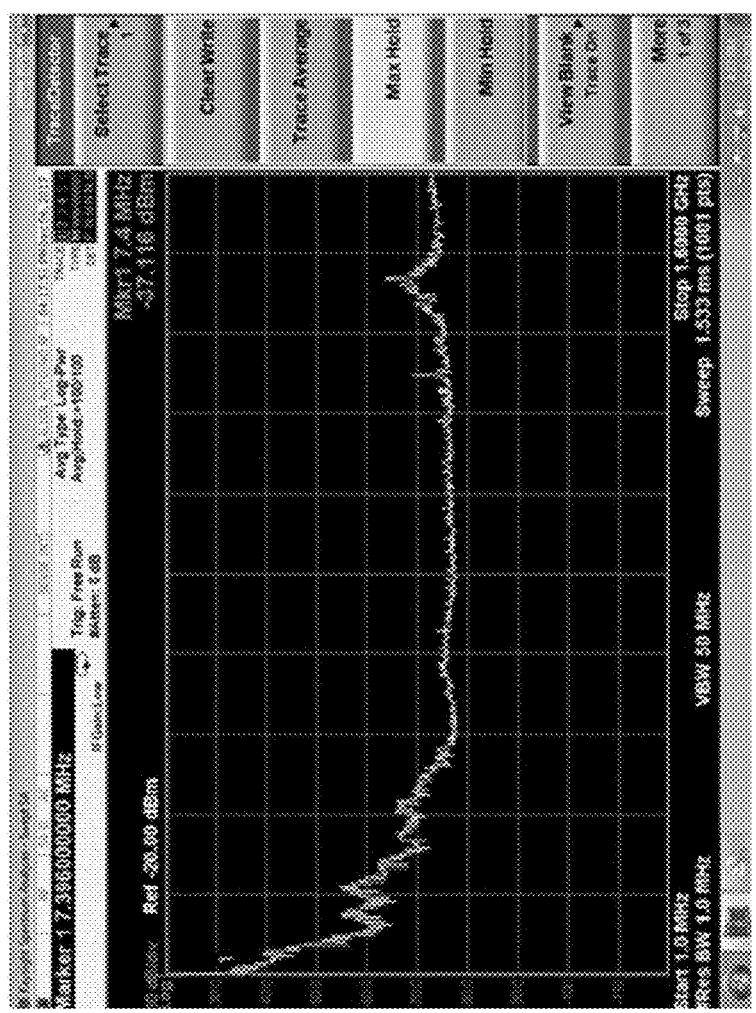
FIG. 8 to FIG. 10 are experimental results of the present invention, and respectively disclose three types of experimental results of not yet using a shielding structure, using only a shielding structure but not yet being grounded, and using a shielding structure as well as being ground.
Figure 9:
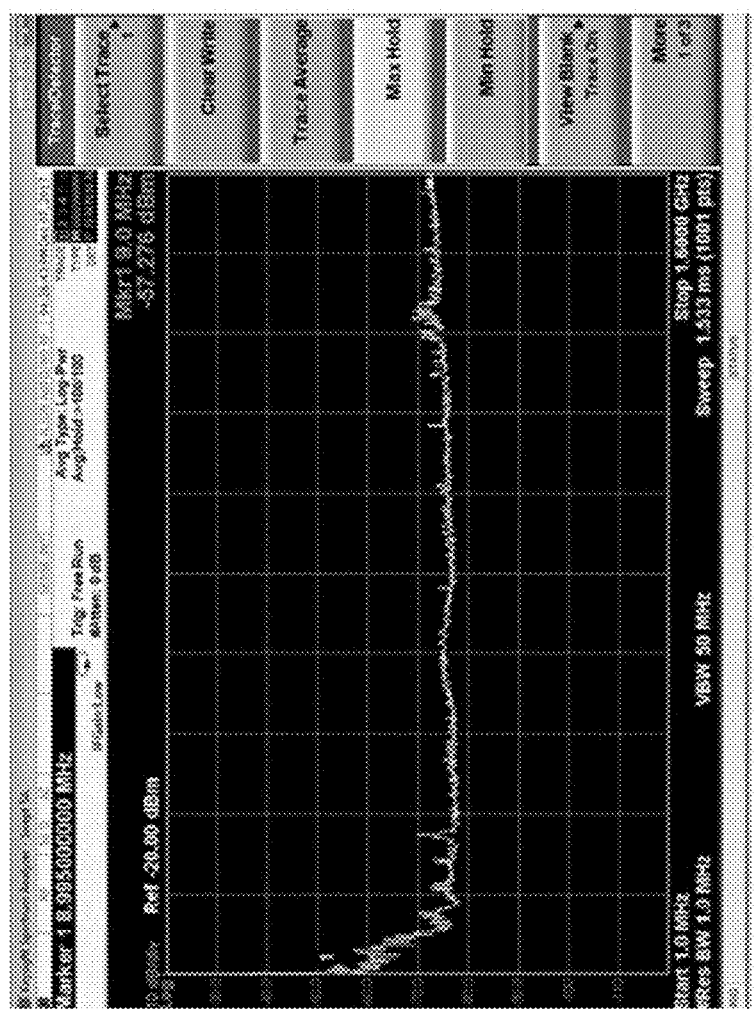
Figure 10:
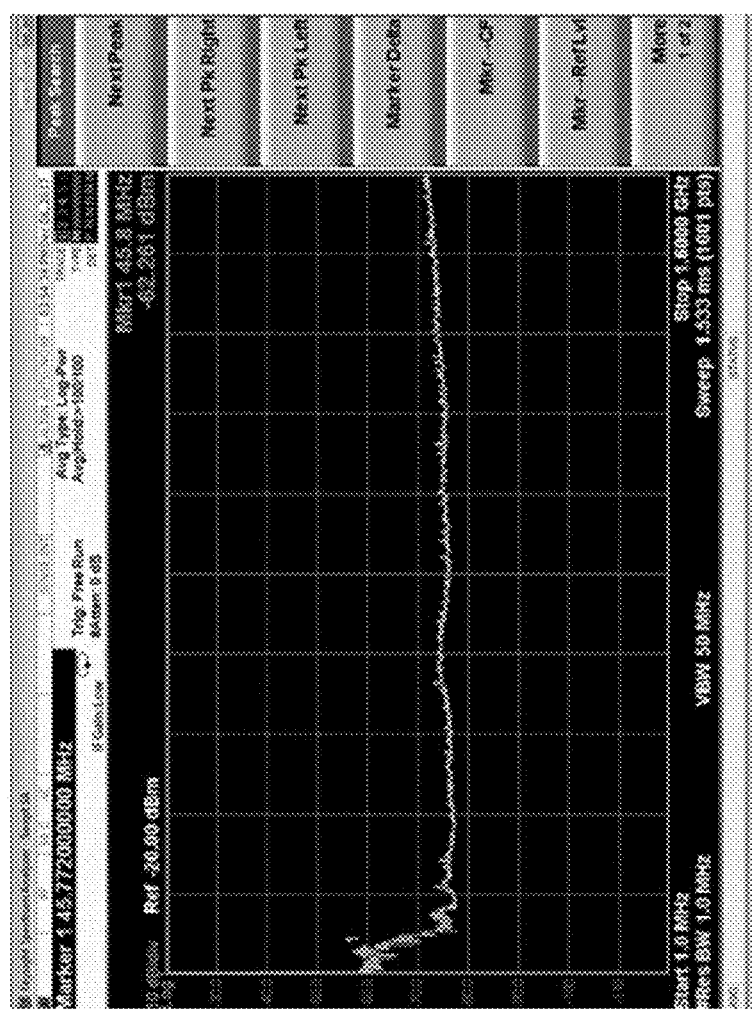

As shown in FIG. 8 to FIG. 10, it is experimentally proven that, when the shielding structure 100 of the present invention is not used, there are numerous noticeable surges (as shown in FIG. 8); when the shielding film 2 of the present invention is used but not yet grounded, there are still some surges (as shown in FIG. 9); when the shielding structure 100 of the present invention is used and grounded, it is apparent that there are no surges (as shown in FIG. 10). Therefore, the shielding structure 100 of the present invention is capable of effectively shielding noise and forwarding noise to other locations by grounding the noise.

In conclusion, the present invention provides the following effects compared to the prior art. With the shielding structure 100, noise is effectively and completely shielded and is grounded, thereby reducing the influence of the noise on a wireless RF component, further providing the wireless RF component with a noise-free or low-noise operating environment.

The present invention further provides other effects. With the elastic deformation function provided by the ground guide member 1 and the ground guide wall 32, it is ensured that, even for the guide portions 231 and the external guide portion 232 that are soft instead of being hard planes, can be in reliably electrical connection with the ground guide member 1 and the ground guide wall 32, respectively. Furthermore, with the external blocking wall assembly 3, the blocking wall breach 91 on the casing 900 can be sealed by means of external connection, further ensuring that noise is completely shielded and is thus grounded.

While the invention has been described by way of the above preferred embodiments, it is to be understood that the invention is not limited thereto. Equivalent structural modifications can be made by a person skilled in the art on the basis of the description and drawings of the disclosure, and such modifications are to be encompassed within the claim scope of the present invention.

What is claimed is:

1. A shielding structure of a circuit board, used for shielding the circuit board, comprising:
    at least one ground guide member, electrically configured on the circuit board; and
    a shielding film, comprising:
        a first insulation layer;
        a second insulation layer, adhered to the circuit board, the second insulation layer provided with at least one opening corresponding to the at least one ground guide member; and
        a metal layer, stacked and connected between the first insulation layer and the second insulation layer, the metal layer exposed via the at least one opening to form at least one guide portion, and the metal layer exposed only on a side connected to the second insulation layer;
    wherein the shielding film is electrically connected to the at least one ground guide member through the at least one guide portion and is thus grounded.

2. The shielding structure of a circuit board according to claim 1, wherein the first insulation layer is a polyethylene terephthalate (PET) film.

3. The shielding structure of a circuit board according to claim 1, wherein the second insulation layer is a polyethylene terephthalate (PET) film.

4. The shielding structure of a circuit board according to claim 1, wherein a material of the metal layer is selected from a group consisting of aluminum, silver and copper.

5. The shielding structure of a circuit board according to claim 1, wherein areas of the first insulation layer and the second insulation layer are both greater than an area of the metal layer, the first insulation layer has a first edge protruding from the metal layer, and the second insulation layer has a second edge protruding from the metal layer.

6. The shielding structure of a circuit board according to claim 5, wherein the first edge and the second edge are mutually adhered, and the metal layer is completely enveloped within the first insulation layer and the second insulation layer.

7. The shielding structure of a circuit board according to claim 1, wherein the ground guide member comprises an elastic support body and a flexible metal plate, and the flexible metal plate encircles the elastic support body and is electrically connected to the circuit board.

8. The shielding structure of a circuit board according to claim 7, wherein the elastic support body is a foam sponge elastically supporting in the flexible metal plate.

9. The shielding structure of a circuit board according to claim 1, wherein a thickness of the metal layer is 0.1 mm.

10. The shielding structure of a circuit board according to claim 9, wherein thicknesses of the first insulation layer and the second insulation layer are both within 0.01 mm to 0.03 mm.

11. An electronic device having a shielding structure, comprising:
   a casing;
   a circuit board, provided in the casing; and
   a shielding structure, comprising:
      at least one ground guide member, electrically configured on the circuit board; and
      a shielding film, comprising: a first insulation layer; a second insulation layer, adhered to the circuit board, the second insulation layer provided with at least one opening corresponding to the at least one ground guide member; and a metal layer, stacked and connected between the first insulation layer and the second insulation layer, the metal layer exposed via the at least one opening to form at least one guide portion, and the metal layer exposed only on a side connected to the second insulation layer;
   wherein the shielding film is electrically connected to the at least one ground guide member through the at least one guide portion and is thus grounded.

12. The electronic device having a shielding structure according to claim 11, wherein the casing is a metal casing and an inner surface thereof is protrudingly provided with at least one metal blocking wall, one surface of the circuit board is protrudingly provided with at least one guide blocking wall, the shielding film is provided with at least one gap corresponding to the at least one guide blocking wall, and the at least one guide blocking wall is exposed via the at least one gap and is correspondingly abutted against the at least one metal blocking wall.

13. The electronic device having a shielding structure according to claim 12, wherein the shielding structure further comprises an external blocking wall assembly, the casing has a blocking wall breach, the external blocking wall assembly is provided on the casing at a position corresponding to the blocking wall breach and is electrically connected to the casing, the first insulation layer is provided with at least one external opening, the metal layer is exposed via the at least one external opening to form at least one external guide portion, and the shielding film is electrically connected to the external blocking wall assembly through the at least one external guide portion and is thus grounded.

14. The electronic device having a shielding structure according to claim 13, wherein the external blocking wall assembly comprises an external circuit board and a ground guide wall, the external circuit board is provided on the casing at a position corresponding to the blocking wall breach and is electrically connected to the casing, the ground guide wall is fixed to the external circuit board and is electrically connected to the external circuit board, and the shielding film is electrically connected to the ground guide wall through the at least one external guide portion.

15. The electronic device having a shielding structure according to claim 14, wherein the ground guide wall comprises an external elastic support body and a flexible guide outer layer, the flexible guide outer layer encircles the external elastic support body, and the flexible guide outer layer is fixed to and in electrical contact with the external circuit board.

* * * * *